United States Patent
Owings et al.

(10) Patent No.: US 11,225,053 B2
(45) Date of Patent: Jan. 18, 2022

(54) INTERFACIAL ADHESION ARTICLE AND METHOD

(71) Applicant: 3M INNOVATIVE PROPERTIES COMPANY, St. Paul, MN (US)

(72) Inventors: Robert R. Owings, Woodbury, MN (US); Kevin W. Gotrik, Hudson, WI (US); Christopher A. Merton, Pt. Louis Park, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 36 days.

(21) Appl. No.: 15/733,045

(22) PCT Filed: Oct. 29, 2018

(86) PCT No.: PCT/IB2018/058455
§ 371 (c)(1),
(2) Date: Apr. 29, 2020

(87) PCT Pub. No.: WO2019/087043
PCT Pub. Date: May 9, 2019

(65) Prior Publication Data
US 2020/0376811 A1    Dec. 3, 2020

Related U.S. Application Data

(60) Provisional application No. 62/579,409, filed on Oct. 31, 2017.

(51) Int. Cl.
*B32B 15/08*    (2006.01)
*C09J 7/28*    (2018.01)
(Continued)

(52) U.S. Cl.
CPC ........... *B32B 15/082* (2013.01); *C09J 1/00* (2013.01); *C09J 7/28* (2018.01); *C09J 2400/16* (2013.01); *C09J 2433/006* (2013.01)

(58) Field of Classification Search
CPC .... B32B 15/082; C09J 7/28; C09J 1/00; C09J 2400/16; C09J 2433/0062
(Continued)

(56) References Cited

U.S. PATENT DOCUMENTS

| | | | |
|---|---|---|---|
| 8,030,140 B2 | 10/2011 | Yeo | |
| 2009/0155583 A1* | 6/2009 | Xu | B82Y 10/00 428/336 |

(Continued)

FOREIGN PATENT DOCUMENTS

| | | |
|---|---|---|
| JP | 2010083776 | 4/2010 |
| JP | 2010083776 A * | 4/2010 |

(Continued)

OTHER PUBLICATIONS

Wynblatt, "The Effects of Interfacial Segregation on Wetting in Solid Metal-On-Metal and Metal-On-Ceramic Systems", Acta Materialia, 2000, vol. 48, pp. 4439-4447.

(Continued)

*Primary Examiner* — Michael M. Bernshteyn

(57) ABSTRACT

An article is provided. The article includes an acrylate layer; a substrate overlaying the acrylate layer; and an adhesive layer between the acrylate layer and the substrate, wherein the adhesive layer includes germanium; wherein a release value between the acrylate layer and the adhesive layer is more than 200 g/inch.

14 Claims, 1 Drawing Sheet

(51) Int. Cl.
*C09J 1/00* (2006.01)
*B32B 15/082* (2006.01)

(58) Field of Classification Search
USPC .......................................... 428/463
See application file for complete search history.

(56) References Cited

U.S. PATENT DOCUMENTS

| | | |
|---|---|---|
| 2010/0197084 A1 | 8/2010 | Yeo |
| 2011/0111300 A1 | 5/2011 | DelHagen |
| 2014/0178675 A1 | 6/2014 | Ha |

FOREIGN PATENT DOCUMENTS

| | | | | |
|---|---|---|---|---|
| JP | 2014205247 A | * | 10/2014 | |
| WO | WO 2009-085741 | | 7/2009 | |
| WO | WO 2018-178802 | | 10/2018 | |
| WO | WO-2018178802 A1 | * | 10/2018 | ......... H01L 51/5253 |

OTHER PUBLICATIONS

International Search Report for PCT International Application No. PCT/IB2018/058455, dated Jan. 3, 2019, 4 pages.

* cited by examiner

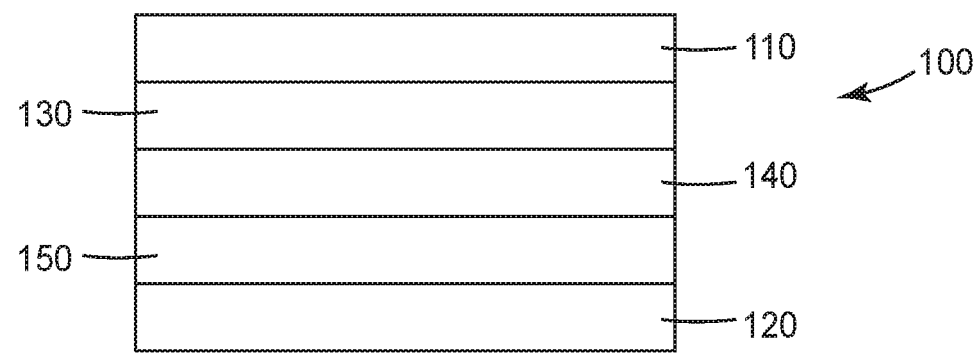

INTERFACIAL ADHESION ARTICLE AND METHOD

FIELD

The present disclosure relates to interfacial adhesion agents and articles. The present disclosure further provides methods of using these articles.

BACKGROUND

Inorganic or hybrid inorganic/organic layers have been used in thin films for electrical, packaging and decorative applications to prevent the degradation. For example, multilayer stacks of inorganic or hybrid inorganic/organic layers can be used to make barrier films resistant to moisture permeation. In some circumstances, metals has been used to release polymer films. While the technology of the prior art may be useful, there exists a need for better binding films useful for product mechanical durability.

SUMMARY

Thus, in one aspect, the present disclosure provides an article comprising: an acrylate layer; a substrate overlaying the acrylate layer; and an adhesive layer between the acrylate layer and the substrate, wherein the adhesive layer comprises germanium; wherein a release value between the acrylate layer and the adhesive layer is more than 400 g/inch.

In another aspect, the present disclosure provides a method comprising: providing a substrate; applying an adhesive layer on the substrate, wherein the adhesive layer comprises germanium; and applying an acrylate layer on the adhesive layer; wherein a release value between the release layer and the acrylate layer is more than 400 g/inch.

Various aspects and advantages of exemplary embodiments of the present disclosure have been summarized. The above Summary is not intended to describe each illustrated embodiment or every implementation of the present disclosure. Further features and advantages are disclosed in the embodiments that follow. The Drawings and the Detailed Description that follow more particularly exemplify certain embodiments using the principles disclosed herein.

Definitions

For the following defined terms, these definitions shall be applied for the entire Specification, including the claims, unless a different definition is provided in the claims or elsewhere in the Specification based upon a specific reference to a modification of a term used in the following definitions:

The terms "about" or "approximately" with reference to a numerical value or a shape means +/− five percent of the numerical value or property or characteristic, but also expressly includes any narrow range within the +/− five percent of the numerical value or property or characteristic as well as the exact numerical value. For example, a temperature of "about" 100° C. refers to a temperature from 95° C. to 105° C., but also expressly includes any narrower range of temperature or even a single temperature within that range, including, for example, a temperature of exactly 100° C. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

The term "release value" with reference to average peel force determined by the test for T-Peel Test Method or 180° Peel Test Method in Examples.

The terms "a", "an", and "the" include plural referents unless the content clearly dictates otherwise. Thus, for example, reference to a material containing "a compound" includes a mixture of two or more compounds.

BRIEF DESCRIPTION OF THE DRAWINGS

The disclosure may be more completely understood in consideration of the following detailed description of various embodiments of the disclosure in connection with the accompanying figures, in which:

FIG. 1 is a side view of an exemplary article according to the present invention.

While the above-identified drawings, which may not be drawn to scale, set forth various embodiments of the present disclosure, other embodiments are also contemplated, as noted in the Detailed Description. In all cases, this disclosure describes the presently disclosed invention by way of representation of exemplary embodiments and not by express limitations. It should be understood that numerous other modifications and embodiments can be devised by those skilled in the art, which fall within the scope and spirit of this disclosure.

DETAILED DESCRIPTION

Before any embodiments of the present disclosure are explained in detail, it is understood that the invention is not limited in its application to the details of use, construction, and the arrangement of components set forth in the following description. The invention is capable of other embodiments and of being practiced or of being carried out in various ways that will become apparent to a person of ordinary skill in the art upon reading the present disclosure. Also, it is understood that the phraseology and terminology used herein is for the purpose of description and should not be regarded as limiting. The use of "including," "comprising," or "having" and variations thereof herein is meant to encompass the items listed thereafter and equivalents thereof as well as additional items. It is understood that other embodiments may be utilized and structural or logical changes may be made without departing from the scope of the present disclosure.

As used in this Specification, the recitation of numerical ranges by endpoints includes all numbers subsumed within that range (e.g. 1 to 5 includes 1, 1.5, 2, 2.75, 3, 3.8, 4, and 5, and the like).

Unless otherwise indicated, all numbers expressing quantities or ingredients, measurement of properties and so forth used in the Specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

An adhesion layer is often used to bind thin films and enable the adhesion of a polymeric layer, for example, an acrylate layer to a substrate or surface of an article or device. The release force should occur with a high enough release force to produce strongly bound thin films. The present disclosure provides an article with improved adhesion between the acrylate layer to the substrate. For example, the article of the present disclosure can be useful as an interface for decorative tape, for decorative color shifting windows, and decorative color shifting car wraps where the polymer-metal interface typically has difficulty adhering. This means the decorative tape fails to completely release when the tape is removed and reapplied.

The present disclosure provides articles and methods of using these articles. Referring now to FIG. 1, an exemplary article 100 according to the present disclosure is illustrated. Article 100 includes an acrylate layer 110, a substrate 120 overlaying the acrylate layer, and an adhesive layer 130 between the acrylate layer 110 and the substrate 120. In the embodiment shown in FIG. 1, the adhesive layer 130 is in direct contact with the acrylate layer 110 and the substrate 120. In other embodiments, there can be additional layers between the acrylate layer 110 and the adhesive layer 130 or between the adhesive layer 130 and the substrate 120. In some embodiments, article 100 can include an optional metal layer 140 and the adhesive layer 130 is in between the metal layer 140 and the acrylate layer 110. In these embodiments, article 100 can include a second adhesive layer 150 between the metal layer 140 and the substrate 120 can the second adhesive layer 150 can include germanium;

In some embodiments, a release value or a peel force between the acrylate layer and the adhesive layer is more than 200 g/inch, 250 g/inch, 300 g/inch, 350 g/inch, 400 g/inch, 450 g/inch, 500 g/inch, 550 g/inch, 600 g/inch, 650 g/inch or 700 g/inch (up to 1500 On). In some embodiments, a release value between the acrylate layer and the adhesive layer is from 200 to 1500 g/inch, from 250 to 1500 g/inch, from 300 to 1500 g/inch, from 350 to 1500 g/inch, from 400 to 1500 g/inch, from 450 to 1500 g/inch, from 500 to 1500 g/inch, from 600 to 1500 g/inch, from 700 to 1500 g/inch, from 800 to 1500 g/inch, from 900 to 1500 g/inch, from 1000 to 1500 g/inch, from 1100 to 1500 g/inch, from 1200 to 1500 g/inch, from 1300 to 1500 g/inch, or from 1400 to 1500 g/inch.

The adhesive layer 130 can include germanium. The adhesive layer can be a continuous or discontinuous layer. The adhesive layer 130 can promote the adhesion between immediately adjacent layers, for example, the acrylate layer 110 and the substrate 120. In some embodiments, more than 90% of the adhesive layer is germanium. In some embodiments, more than 95% of the adhesive layer is germanium. In some embodiments, the adhesive layer consists essentially of germanium (more than 99% of the adhesive layer is germanium). In some embodiments, the adhesive layer consists of germanium. In some embodiments, the thickness of the adhesive layer is less than 20 nm, 15 nm, 12 nm, 10 nm, 9 nm, 8 nm, 7 nm, 6 nm, 5 nm, 4 nm, 3 nm, or 2 nm. In some embodiments, the thickness of the adhesive layer is from 1 nm, to 15 nm, from 1 nm to 12 nm, from 1 nm to 9 nm or from 1 nm to 6 nm.

A method of the present disclosure can be used to provide the adhesion between the acrylate layer 110 and the substrate 120. The method can include providing the substrate of the present disclosure, applying the adhesive layer of the present disclosure on the substrate and applying the acrylate layer on the adhesive layer.

Substrate

In some embodiments, the substrate 120 can include a metal layer. The metal layer may include at least one selected from the group consisting of individual metals, two or more metals as mixtures, inter-metallics or alloys, semi-metals or metalloids, metal oxides, metal and mixed metal oxides, metal and mixed metal fluorides, metal and mixed metal mitrides, metal and mixed metal carbides, metal and mixed metal oxy borides, metal and mixed metal silicides, diamond-like carbon, diamond-like glass, graphene, and combinations thereof. In some embodiments, the metal layer may conveniently be formed of Al, Zr, Sn, Cr, Cu, Ni, Ti, or Nb with a thickness between 1-3000 nm. In some embodiments, the substrate 120 can include a doped semiconductor layer. In some embodiments, the doped semiconductor layer may conveniently be formed of Si, B-doped Si, Al-doped Si, P-doped Si with thicknesses between 1-3000 nm. A particularly suitable doped semiconductor layer is Al-doped Si, wherein the Al compositional percentage is 10%. The metal layer can typically be prepared by evaporation, reactive evaporation, sputtering, reactive sputtering, chemical vapor deposition, plasma enhanced chemical vapor deposition, and atomic layer deposition. Preferred methods include vacuum preparations such as sputtering and evaporation.

In some embodiments, the substrate 120 can include a polymeric film. The polymeric film can be selected from polyolefins, halogenated polyolefins, polyamides, polystyrenes, nylon, polyesters, polyester copolymers, polyurethanes, polysulfones, styrene-maleic anhydride copolymers, styrene-acrylonitrile copolymers, ionomers based on sodium or zinc salts or ethylene methacrylic acid, polymethyl methacrylates, cellulosics, acrylic polymers and copolymers, polycarbonates, polyacrylonitriles ethylene-vinyl acetate copolymers, and fluoropolymers. In some embodiments, suitable substrate 120 can be conveniently an organic polymeric layer that is processed to be heat-shrinkable by any suitable means. Semicrystalline or amorphous polymers can be made heat-shrinkable by orienting them at a temperature above their glass transition temperature, Tg, and then cooling. Examples of useful semicrystalline polymeric films include polyolefins such as polyethylene (PE), polypropylene (PP), and syndiotactic polystyrene (sPS); polyesters such as polyethylene terephthalate (PET), polyethylene napthalate (PEN), and polyethylene-2,6-naphthalate; fluorpolymers such as polyvinylidene difluoride, and ethylene: tetrafluoroethylene copolymers (ETFE); polyamides such as Nylon 6 and Nylon 66; polyphenylene oxide, and polyphenylene sulfide. Examples of amorphous polymer films include polymethylmethacrylate (PMMA), polyimides (PI), polycarbonate (PC), polyether sulfone (PES), atactic polystyrene (aPS), polyvinyl chloride (PVC), and norbornene based cyclic olefin polymer (COP) and cyclic olefin copolymer (COC). Some polymer materials are available in both semicrystalline and amorphous forms. Semicrystalline polymers such as those listed above can also be made heat-shrinkable by heating to the peak crystallization temperature and cooling.

Acrylate Layer

The acrylate layer may be made from the same material or different materials. In some embodiments, the acrylate layer can include an acrylate or an acrylamide. When the acrylate layer is to be formed by flash evaporation of the monomer, vapor deposition, followed by crosslinking, volatilizable acrylate and methacrylate (referred to herein as "(meth)acrylate") or acrylamide or methacrylamide (referred to herein as "(meth)acrylamide") monomers are useful, with volatilizable acrylate monomers being preferred. A suitable (meth) acrylate or (meth) acrylamide monomer has sufficient vapor pressure to be evaporated in an evaporator and condensed into a liquid or solid coating in a vapor coater.

Examples of suitable monomers include, but are not limited to, hexanediol diacrylate; ethoxyethyl acrylate; cyanoethyl (mono)acrylate; isobornyl (meth)acrylate; octadecyl acrylate; isodecyl acrylate; lauryl acrylate; beta-carboxyethyl acrylate; tetrahydrofurfuryl acrylate; dinitrile acrylate; pentafluorophenyl acrylate; nitrophenyl acrylate; 2-phenoxyethyl (meth)acrylate; 2,2,2-trifluoromethyl (meth)acrylate; diethylene glycol diacrylate; triethylene glycol di(meth)acrylate; tripropylene glycol diacrylate; tetraethylene glycol diacrylate; neo-pentyl glycol diacrylate; propoxylated neopentyl glycol diacrylate; polyethylene glycol diacrylate; tetraethylene glycol diacrylate; bisphenol A epoxy diacrylate; 1,6-hexanediol dimethacrylate; trimethylol propane triacrylate; ethoxylated trimethylol propane triacrylate; propylated trimethylol propane triacrylate; tris(2-hydroxyethyl)-isocyanurate triacrylate; pentaerythritol triacrylate; phenylthioethyl acrylate; naphthloxyethyl acrylate; neopentyl glycol diacrylate, MIRAMER M210 (available from Miwon Specialty Chemical Co., Ltd., Korea), KAYARAD R-604 (available from Nippon Kayaku Co., Ltd., Tokyo, Japan), epoxy acrylate under the product number RDX80094 (available from RadCure Corp., Fairfield, N. J.); and mixtures thereof. A variety of other curable materials can be included in the polymer layer, such as, e.g., vinyl ethers, vinyl mapthalene, acrylonitrile, and mixtures thereof.

In particular, tricyclodecane dimethanol diacrylate is considered suitable. It is conveniently applied by, e.g., condensed organic coating followed by UV, electron beam, or plasma initiated free radical polymerization. A thickness between about 10 and 10000 nm is considered convenient, with approximately between about 10 and 5000 nm in thickness being considered particularly suitable. In some embodiments, thickness of the organic layer can be between about 10 and 3000 nm.

The following embodiments are intended to be illustrative of the present disclosure and not limiting.

EMBODIMENTS

Embodiment 1 is an article comprising: an acrylate layer; a substrate overlaying the acrylate layer; and an adhesive layer between the acrylate layer and the substrate, wherein the adhesive layer comprises germanium; wherein a release value between the acrylate layer and the adhesive layer is more than 200 g/inch.

Embodiment 2 is the article of embodiment 1, wherein the release value between the acrylate layer and the adhesive layer is more than 400 g/inch.

Embodiment 3 is the article of any one of embodiments 1 to 2, wherein the release value between the acrylate layer and the adhesive layer is more than 500 g/inch.

Embodiment 4 is the article of any one of embodiments 1 to 3, wherein the thickness of the adhesive layer is less than 10 nm.

Embodiment 5 is the article of any one of embodiments 1 to 4, wherein more than 90% of the adhesive layer is germanium.

Embodiment 6 is the article of any one of embodiments 1 to 5, wherein more than 95% of the adhesive layer is germanium.

Embodiment 7 is the article of any one of embodiments 1 to 6, wherein the substrate comprises a metal layer.

Embodiment 8 is the article of embodiment 7, wherein the metal layer comprises at least one selected from the group consisting of individual metals, two or more metals as mixtures, inter-metallics or alloys, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, and combinations thereof.

Embodiment 9 is the article of any one of embodiments 1 to 8, wherein the substrate comprises a polymeric film.

Embodiment 10 is the article of embodiment 9, wherein the polymeric film is selected from polyolefins, halogenated polyolefins, polyamides, polystyrenes, nylon, polyesters, polyester copolymers, polyurethanes, polysulfones, styrene-maleic anhydride copolymers, styrene-acrylonitrile copolymers, ionomers based on sodium or zinc salts or ethylene methacrylic acid, polymethyl methacrylates, cellulosics, acrylic polymers and copolymers, polycarbonates, polyacrylonitriles ethylene-vinyl acetate copolymers, and fluoropolymers.

Embodiment 11 is the article of any one of embodiments 1 to 10, further comprising a metal layer, wherein the adhesive layer is in between the metal layer and the acrylate layer.

Embodiment 12 is the article of embodiment 11, further comprising a second adhesive layer between the metal layer and the substrate, wherein the second adhesive layer comprises germanium.

Embodiment 13 is a method comprising: providing a substrate; applying an adhesive layer on the substrate, wherein the adhesive layer comprises germanium; and applying an acrylate layer on the adhesive layer; wherein a release value between the release layer and the acrylate layer is more than 200 g/inch.

EXAMPLES

The following example is intended to illustrate exemplary embodiments within the scope of this disclosure. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. All percentages are by weight, unless otherwise noted. Reagents are from the Sigma-Aldrich Corporation (St. Louis, Mo.) unless otherwise noted. At the very least, and not as an attempt to limit the application of the doctrine of equivalents to the scope of the claims, each numerical parameter should at least be construed in light of the number of reported significant digits and by applying ordinary rounding techniques.

Example 1

A thin film structure was made as described below and presented in Table 1. All layers were formed using a vacuum coating apparatus similar to the one described in FIG. 3 of WO2009085741. A 0.075 mm thick PET film available from DuPont Teijin Films under the designation Melinex™ 454 or similar was used for the substrate. Germanium (ACI Alloys, San Jose, Calif.) was DC sputter deposited at a power density of 4 W/cm$^2$. Acrylate monomer was then evaporated and condensed on the web and cured with a 7 kV 7 mA electron beam. The thickness of the deposited germanium layer was varied during the course of the experiment and is provided in Table 1. An acrylate monomer such as tricyclodecane dimethanol diacrylate (trade name SR833, Sartomer, Exton, Pa.), and the thickness of the cured acrylate layer was 475 nm. On the cured acrylate layer a 60 nm thick layer of DC sputtered aluminum was deposited at 4 W/cm$^2$.

Cross web sheets of approximately A4 size were cut from the coated roll and tested for adhesion using burgundy tape (part #S2822 Adhesive Applications, Inc., Easthampton, Mass.) laminated to the aluminum surface of each test specimen with a five pound weighted roller. The adhesive performance of the test specimens was evaluated by rapidly pulling the burgundy tape from each test specimen by hand, as fast as possible, and the results were qualitatively evaluated in a binary format of pass or fail. To pass, no amount of material could be removed by the tape. In separate experiments, the adhesive force of burgundy tape laminated to glass was measured at 1250-1500 g/inch.

Process 1: Process for Preparing a Thin Film Stack having Three Layers

A thin film stack comprising a relatively thick layer of a metal (Al, Ag, or Sn), a cured acrylate layer, and a relatively thin layer of a material (Al, Ag, SiAl, Cr, CrNi, NiCr, Ni, Zr, Zn, Sn, Cu, AlO, SiAlOx, SiAlOxNy, Ge) was deposited on a PET film substrate similar to that mentioned above.

(Layer 1) The substrate was loaded into a vacuum coater and the chamber pumped down to a base pressure of less than 1×10$^{-4}$ Torr. A layer of one of the metals listed above approximately 2 nm-20 nm thick was deposited on the PET using a magnetron sputtering process. A target of 99.9% purity or higher was used for the deposition of this layer. Gas flow consisting of 100% argon was used in the deposition process to maintain a pressure in the sputtering zone of approximately 3 mTorr.

(Layer 2) Layer 1 was exposed to a low pressure 3-5 mTorr N$_2$ plasma pre-treatment process using a titanium target run at 20 W. An acrylate monomer (trade name SR833, Sartomer, Exton, Pa.) was flash evaporated and condensed on layer 1 and cured with electron beam radiation conditions similar to those used in Example 1. The monomer flow rate, monomer condensation rate, and web speed were chosen to result in a cured polymer layer thickness of approximately 90 nm-700 nm.

(Layer 3) A metal layer 5 nm to 150 nm thick was deposited on layer 2 using a magnetron sputtering process. An aluminum target consisting of at least 99% Al was used for the deposition of this layer. Gas flow of 100% argon pressurized the sputtering zone to approximately 3 mTorr.

Process 2: Process for Preparing a Thin Film Structure having Two Layers

A film sample was produced according to Process 1 except that during the deposition, layer 3 was not applied to the stack.

Process 3: Process for Preparing Thin Film Stacks having Multiple Layers Under the First Cured Monomer Layer.

A film sample produced according to the process described in Process 1, except layer 1 is replaced with 2 to 3 layers forming a stack comprising, first a germanium coating from greater than 0 nm to 5 nm thick, second a material from the list described in process 1 coated from greater than 0 nm to 20 nm thick, third a germanium coating greater than 0 nm to 5 nm thick.

Process 4: Process for Preparing Thin Film Stacks with No Top Aluminum Layer.

A film sample produced according to the process described in Process 2, except layer 1 is replaced with up to 3 layers forming a stack comprising, first a germanium coating greater than 0 nm to 5 nm thick, second a material from the list described in process 1 coated from 1 nm to 10 nm thick, third a germanium coating 1 nm to 5 nm thick.

Process 5: Process for preparing a Thin Film Stack Having 3, 5, 7, 9, or more Layers with the same Metal Layers.

A film sample of 3 layers can be produced according to Process 1 except layer 3 is the same as layer 1. After the film stack has been fabricated in this manner, additional dyad layers according to layer 2 and layer 1 of Process 1 can be deposited to produce 5, 7, 9, 11, 13, 15 or more layer stacks.

Process 6 (Prophetic): Process for preparing a Thin Film Stack Having Five, Seven, Nine, or more Layers with a Top Aluminum or Silver Mirror Layer.

A film sample can be produced according to the process described in Process 5 with the last deposited layer of the film stack being deposited according to the process described as layer 3 of Process 1 to produce a 5, 7, 9, or more layer stack.

Process 7 (Prophetic): Process for preparing a thin film stack having four, six, eight, or more layers with an optional top layer A film sample can be produced according to the process described in Process 2, and in a continuation of the process, two additional layers deposited according to Process 2 to create a four layer stack. Additional layer dyads according to process 2 can be deposited to create film stacks having 6, 8, or more layers.

Results

Table 1 describes film stack samples made using Processes 1-4. To evaluate adhesion of layers, tape tests were performed with burgundy tape (Part #S2822 Adhesive Applications, Inc. (Easthampton, Mass.) by rolling the tape down with a five pound roller, then manually removing the tape as fast as possible. "Pass" means no film was removed. "Fail" means all film was removed, "Partial" means some film was removed. Peel forces were then measured on the films that had "Fail" or "Partial" designations according to the method described in ASTM D3330M-04(2010). An iMass SP-2100 (IMASS, Inc., Accord, Mass.) was used to conduct 180° peel tests at 300 inches per minute using specimens prepared by application of the burgundy tape rolled on to the films with a five pound roller as previously described. The peel force for "Failed" samples was always less than 100 On and the "Partial" samples did not fail under the conditions of the iMass 180° peel testing. All "Partial" samples had peel forces greater than 800 Ow

TABLE 1

Compositions and layer thickness of thin film structures,
tape test results, and peel force results.

| | | Layer 1 | | | | Layer 2 | Layer 3 | | Peel force |
|---|---|---|---|---|---|---|---|---|---|
| Sample # | Process | 1st Ge nm | material | nm | 2nd Ge nm | nm | nm | Tape Result | g/in |
| 1 | 4 | 0 | SiAlOx | 12.5 | 3 | 500 | 0 | Pass | |
| 2 | 4 | 3 | SiAlOx | 12.5 | 0 | 500 | 0 | Fail | 34.5 |
| 3 | 4 | 3 | SiAlOx | 12.5 | 3 | 500 | 0 | Partial | 1088 |
| 4 | 4 | 1 | SiAlOx | 12.5 | 1 | 500 | 0 | Pass | |
| 5 | 3 | 1 | SiAlOx | 12.5 | 1 | 500 | 60 | Pass | |
| 6 | 3 | 3 | SiAlOx | 12.5 | 3 | 500 | 60 | Pass | |
| 7 | 3 | 3 | SiAlOx | 12.5 | 0 | 500 | 60 | Fail | 38.5 |
| 8 | 3 | 3 | SiAl | 8 | 0 | 500 | 60 | Fail | 50.15 |
| 9 | 3 | 3 | SiAl | 8 | 3 | 500 | 60 | Pass | |
| 10 | 3 | 1 | SiAl | 8 | 1 | 500 | 60 | Pass | |
| 11 | 4 | 1 | SiAl | 8 | 1 | 500 | 0 | Pass | |
| 12 | 4 | 3 | SiAl | 8 | 3 | 500 | 0 | Pass | |
| 13 | 4 | 3 | SiAl | 8 | 0 | 500 | 0 | Fail | 22 |
| 14 | 4 | 0 | SiAl | 8 | 3 | 500 | 0 | Pass | |
| 15 | 4 | 0 | CrNi | 6.5 | 3 | 500 | 0 | Pass | |
| 16 | 4 | 3 | CrNi | 6.5 | 0 | 500 | 0 | Fail | 9.75 |
| 17 | 4 | 3 | CrNi | 6.5 | 3 | 500 | 0 | Pass | |
| 18 | 4 | 1 | CrNi | 6.5 | 1 | 500 | 0 | Pass | |
| 19 | 3 | 1 | CrNi | 6.5 | 1 | 500 | 60 | Pass | |
| 20 | 3 | 3 | CrNi | 6.5 | 3 | 500 | 60 | Pass | |
| 21 | 3 | 3 | CrNi | 6.5 | 0 | 500 | 60 | Fail | 7 |
| 22 | 1 | 0 | Ge | 9 | 0 | 500 | 60 | Pass | |
| 23 | 2 | 0 | Ge | 9 | 0 | 500 | 0 | Pass | |
| 24 | 4 | 0 | Sn | 5.5 | 3 | 500 | 0 | Pass | |
| 25 | 4 | 3 | Sn | 5.5 | 0 | 500 | 0 | Fail | 14 |
| 26 | 4 | 3 | Sn | 5.5 | 3 | 500 | 0 | Pass | |
| 27 | 4 | 1 | Sn | 5.5 | 1 | 500 | 0 | Pass | |
| 28 | 3 | 1 | Sn | 5.5 | 1 | 500 | 60 | Pass | |
| 29 | 3 | 3 | Sn | 5.5 | 3 | 500 | 60 | Pass | |
| 30 | 3 | 3 | Sn | 5.5 | 0 | 500 | 60 | Fail | 11.5 |
| 31 | 3 | 3 | AlOx | 5 | 0 | 500 | 60 | Fail | 22.1 |
| 32 | 3 | 3 | AlOx | 5 | 3 | 500 | 60 | Pass | |
| 33 | 3 | 1 | AlOx | 5 | 1 | 500 | 60 | Pass | |
| 34 | 4 | 1 | AlOx | 5 | 1 | 500 | 0 | Pass | |
| 35 | 4 | 3 | AlOx | 5 | 3 | 500 | 0 | Pass | |
| 36 | 4 | 3 | AlOx | 5 | 0 | 500 | 0 | Fail | 28.45 |
| 37 | 4 | 0 | AlOx | 5 | 3 | 500 | 0 | Pass | |
| 38 | 4 | 0 | Al | 5 | 3 | 500 | 0 | Pass | |
| 39 | 4 | 3 | Al | 5 | 0 | 500 | 0 | Fail | 22.7 |
| 40 | 4 | 3 | Al | 5 | 3 | 500 | 0 | Pass | |
| 41 | 4 | 1 | Al | 5 | 1 | 500 | 0 | Pass | |
| 42 | 3 | 1 | Al | 5 | 1 | 500 | 60 | Pass | |
| 43 | 3 | 3 | Al | 5 | 3 | 500 | 60 | Partial | 986 |
| 44 | 3 | 3 | Al | 5 | 0 | 500 | 60 | Fail | 40 |
| 45 | 1 | 0 | Ge | 9 | 0 | 500 | 60 | Pass | |
| 46 | 2 | 0 | Ge | 9 | 0 | 500 | 0 | Pass | |
| 47 | 4 | 0 | SiAlOxNy | 10 | 3 | 500 | 0 | Pass | |
| 48 | 4 | 3 | SiAlOxNy | 10 | 0 | 500 | 0 | Fail | 24.4 |
| 49 | 4 | 3 | SiAlOxNy | 10 | 3 | 500 | 0 | Pass | |
| 50 | 4 | 1 | SiAlOxNy | 10 | 1 | 500 | 0 | Pass | |
| 51 | 3 | 1 | SiAlOxNy | 10 | 1 | 500 | 60 | Pass | |
| 52 | 3 | 3 | SiAlOxNy | 10 | 3 | 500 | 60 | Pass | |
| 53 | 3 | 3 | SiAlOxNy | 10 | 0 | 500 | 60 | Fail | 43.25 |
| 54 | 3 | 3 | NbO | 7 | 0 | 500 | 60 | Fail | 89.5 |
| 55 | 3 | 3 | NbO | 7 | 3 | 500 | 60 | Pass | |
| 56 | 3 | 1 | NbO | 7 | 1 | 500 | 60 | Pass | |
| 57 | 4 | 1 | NbO | 7 | 1 | 500 | 0 | Pass | |
| 58 | 4 | 3 | NbO | 7 | 3 | 500 | 0 | Pass | |
| 59 | 4 | 3 | NbO | 7 | 0 | 500 | 0 | Pass | |
| 60 | 4 | 0 | NbO | 7 | 3 | 500 | 0 | Pass | |
| 61 | 4 | 0 | Nb | 7 | 3 | 500 | 0 | Pass | |
| 62 | 4 | 3 | Nb | 7 | 0 | 500 | 0 | Fail | 17.55 |
| 63 | 4 | 3 | Nb | 7 | 3 | 500 | 0 | Pass | |
| 64 | 4 | 1 | Nb | 7 | 1 | 500 | 0 | Pass | |
| 65 | 3 | 1 | Nb | 7 | 1 | 500 | 60 | Pass | |
| 66 | 3 | 3 | Nb | 7 | 3 | 500 | 60 | Pass | |
| 67 | 3 | 3 | Nb | 7 | 0 | 500 | 60 | Pass | |
| 68 | 1 | 0 | Ge | 9 | 0 | 500 | 60 | Partial | 961 |
| 69 | 2 | 0 | Ge | 9 | 0 | 500 | 0 | Pass | |

All references and publications cited herein are expressly incorporated herein by reference in their entirety into this disclosure. Illustrative embodiments of this invention are discussed and reference has been made to possible variations within the scope of this invention. For example, features depicted in connection with one illustrative embodiment may be used in connection with other embodiments of the invention. These and other variations and modifications in the invention will be apparent to those skilled in the art without departing from the scope of the invention, and it should be understood that this invention is not limited to the illustrative embodiments set forth herein. Accordingly, the invention is to be limited only by the claims provided below and equivalents thereof.

What is claimed is:

1. An article comprising:
   an acrylate layer, wherein the acrylate layer is a non-adhesive film;
   a substrate overlaying the acrylate layer; and
   an adhesive layer between the acrylate layer and the substrate, wherein the adhesive layer comprises germanium;
   wherein a release value between the acrylate layer and the adhesive layer is more than 200 g/inch.

2. The article of claim 1, wherein the release value between the acrylate layer and the adhesive layer is more than 400 g/inch.

3. The article of claim 1, wherein the release value between the acrylate layer and the adhesive layer is more than 500 g/inch.

4. The article of claim 1, wherein the thickness of the adhesive layer is less than 10 nm.

5. The article of claim 1, wherein more than 90% of the adhesive layer is germanium.

6. The article of claim 1, wherein more than 95% of the adhesive layer is germanium.

7. The article of claim 1, wherein the substrate comprises a metal layer.

8. The article of claim 7, wherein the metal layer comprises at least one selected from the group consisting of individual metals, two or more metals as mixtures, intermetallics or alloys, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, and combinations thereof.

9. The article of claim 1, wherein the substrate comprises a polymeric film.

10. The article of claim 9, wherein the polymeric film is selected from polyolefins, halogenated polyolefins, polyamides, polystyrenes, nylon, polyesters, polyester copolymers, polyurethanes, polysulfones, styrene-maleic anhydride copolymers, styrene-acrylonitrile copolymers, ionomers based on sodium or zinc salts or ethylene methacrylic acid, polymethyl methacrylates, cellulosics, acrylic polymers and copolymers, polycarbonates, polyacrylonitriles ethylene-vinyl acetate copolymers, and fluoropolymers.

11. The article of claim 1, further comprising a metal layer, wherein the adhesive layer is in between the metal layer and the acrylate layer.

12. The article of claim 11, further comprising a second adhesive layer between the metal layer and the substrate, wherein the second adhesive layer comprises germanium.

13. A method comprising:
    providing a substrate;
    applying an adhesive layer on the substrate, wherein the adhesive layer comprises germanium; and
    applying an acrylate layer on the adhesive layer, wherein the acrylate layer is a non-adhesive film;
    wherein a release value between the release layer and the acrylate layer is more than 200 g/inch.

14. The article of claim 1, wherein the adhesive layer is in direct contact with the acrylate layer.

* * * * *